(12) United States Patent
Yamaguchi et al.

(10) Patent No.: US 6,855,576 B2
(45) Date of Patent: Feb. 15, 2005

(54) METHOD FOR CLEANING A CERAMIC MEMBER FOR USE IN A SYSTEM FOR PRODUCING SEMICONDUCTORS, A CLEANING AGENT AND A COMBINATION OF CLEANING AGENTS

(75) Inventors: Shinji Yamaguchi, Ama-gun (JP); Taiji Kiku, Handa (JP); Nobuyuki Kondou, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 31 days.

(21) Appl. No.: 10/271,002

(22) Filed: Oct. 15, 2002

(65) Prior Publication Data

US 2003/0080333 A1 May 1, 2003

(30) Foreign Application Priority Data

Nov. 1, 2001 (JP) ........................................ 2001-336419

(51) Int. Cl.$^7$ ................................................ H01L 21/44
(52) U.S. Cl. ........................................ 438/115; 438/906
(58) Field of Search ........................... 438/115, 906, 438/134.7, 134.6, 134.26

(56) References Cited

U.S. PATENT DOCUMENTS

| 4,234,367 A | * 11/1980 | Herron et al. | ........... 156/89.16 |
|---|---|---|---|
| 6,387,189 B1 | 5/2002 | Gröschl et al. | ................ 134/26 |
| 6,423,148 B1 | * 7/2002 | Aoki | .............................. 134/3 |
| 6,444,583 B2 | 9/2002 | Aoki | |
| 6,565,667 B2 | * 5/2003 | Haerle et al. | ................... 134/7 |

FOREIGN PATENT DOCUMENTS

| JP | 2001-507750 A1 | 6/2001 |
|---|---|---|
| JP | 2004-505445 A1 | 2/2004 |
| KR | 2000-0059384 A1 | 10/2000 |
| KR | 2000-0068729 | 11/2000 |
| KR | 2003-0019610 A1 | 3/2003 |
| WO | WO 98/30661 A1 | 7/1998 |
| WO | WO 02/09161 A2 | 1/2002 |

* cited by examiner

*Primary Examiner*—Chandra Chaudhari
(74) *Attorney, Agent, or Firm*—Burr & Brown

(57) ABSTRACT

The present invention provides a method for cleaning a ceramic member for use in a system for producing semiconductors. The method has the step of cleaning the ceramic member with an organic acid or a weak acid. Preferably, the ceramic member is cleaned with a strong acid before the cleaning with an organic acid or a weak acid. The ceramic member may be subjected to a blasting treatment before the cleaning with an organic acid or a weak acid. According to the method, the amount of metal transferred from the ceramic member to a semiconductor may be considerably reduced.

8 Claims, 4 Drawing Sheets

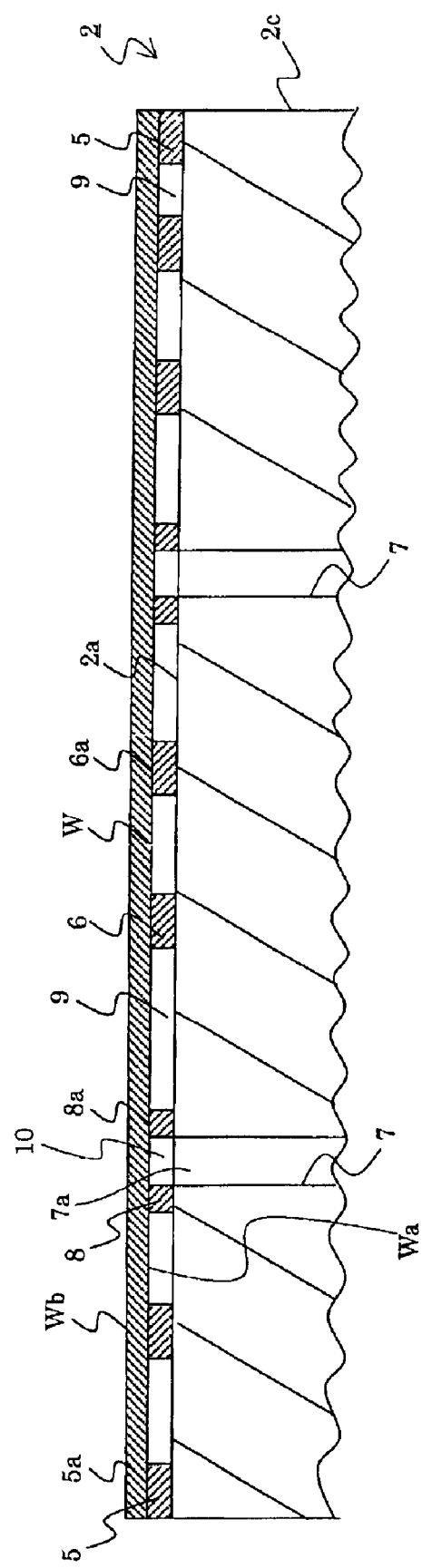

METHOD FOR CLEANING A CERAMIC MEMBER FOR USE IN A SYSTEM FOR PRODUCING SEMICONDUCTORS, A CLEANING AGENT AND A COMBINATION OF CLEANING AGENTS

This application claims the benefit of Japanese Patent Application P2001-336419 filed on Nov. 1, 2001, the entirety of which is incorporated by reference.

BACKGROUND OF THE INVENTION

1. Field of the Invention

This invention relates to a method for cleaning a ceramic member for use in a system for producing semiconductors, a cleaning agent and a combination of cleaning agents.

2. Related Art Statement

Recently, an electrostatic chuck has been used for adsorbing and supporting a semiconductor wafer in various processes such as conveying of a wafer, exposure, fine working, cleaning, etching, dicing and film forming such as sputtering and CVD. A ceramic heater for heating a semiconductor wafer and an electrode device for generating a high frequency have been also commercialized.

Recently, a finer wiring rule for a semiconductor has been applied. For example, a fine wiring according to a wiring rule of not larger than 0.13 µm has been applied. Such a finer wiring rule may present a problem of a low level metal contamination, which has not been considered problematic in conventional wiring rules. That is, when a silicon wafer is mounted on a ceramic member and heated at a high temperature, for example, of not lower than 500° C., a trace amount of metal atoms present in the surface region of the ceramic member may be transferred and diffused into the silicon wafer. Such diffusion of the metal atoms may induce semiconductor defects and results in off-specification products.

It has been known to subject a ceramic member to ultrasonic cleaning using an organic solvent and purified water for preventing the metal contamination of the silicon wafer mounted on the member.

SUMMARY OF THE INVENTION

As the wiring rule becomes finer, it is demanded to considerably reduce the metal contamination of the back side of a silicon wafer. For example, it is demanded to reduce the amount of metal atoms diffused into the wafer at a value of not more than $1 \times 10^{11}$ atoms/cm$^2$ for an eight-inch wafer. To cope with this problem, the inventors have tried to apply powdered materials each having a high purity for manufacturing a ceramic member. Metal atoms, however, may diffuse into the back side of a silicon wafer at an amount exceeding the upper limit value described above, depending on the specification and method of production of the ceramic member. A countermeasure has been demanded for this problem.

An object of the present invention is to provide a novel method for cleaning a ceramic member for use in a system for producing a semiconductor, and to considerably reduce the amount of metal atoms transferred from a ceramic member to the semiconductor.

The present invention provides a method for cleaning a ceramic member for use in a system for producing semiconductors, the method comprising the step of cleaning the ceramic member with an organic acid.

The present invention further provides a cleaning agent for cleaning a ceramic member for use in a system for producing semiconductors, the cleaning agent comprising an organic acid.

The present invention further provides a method for cleaning a ceramic member for use in a system for producing semiconductors, the method comprising the step of cleaning the ceramic member with a weak acid. The present invention further provides a cleaning agent for cleaning a ceramic member for use in a system for producing semiconductors, the cleaning agent comprising a weak acid.

The present invention further provides a combination of cleaning agents for cleaning a ceramic member for use in a system for producing semiconductors, the combination comprising a strong acid and an organic acid.

The present invention further provides a combination of cleaning agents for cleaning a ceramic member for use in a system for producing semiconductors, the combination comprising a strong acid and a weak acid.

In response to a trace amount of metal contaminants being diffused into the surface region of a ceramic member, the inventors attempted to clean the ceramic member with an organic acid or a weak acid. They ultimately discovered that the transfer and diffusion of the metal atoms or contaminants from the surface region of the ceramic member to a semiconductor may be considerably reduced by cleaning the member with an organic acid or a weak acid. The present invention is based on these findings.

Heretofore, so-called RCA cleaning and HF—HNO$_3$ cleaning methods are known for cleaning a semiconductor wafer (not a ceramic member for mounting the wafer). In the RCA cleaning method, a silicon wafer is cleansed with SC-1 cleaning agent (NH$_4$OH:H$_2$O$_2$:H$_2$O=1:1:5), dilute HF and SC-2 cleaning agent (HCl:H$_2$O$_2$:H$_2$O=1:1:5).

The inventors have treated a ceramic member with various cleaning methods and made intensive efforts to reduce the diffusion of metal elements from a ceramic member to a semiconductor. The inventors have investigated cleaning methods with a nylon scrub brush, a melamine foam, SC-1 cleaning agent, nitric acid and hydrochloric acid. The inventors have, however, failed to reduce the amount of metal atoms transferred from a ceramic member to a silicon wafer to a value of not more than $1 \times 10^{11}$ atoms/cm$^2$, by means of any one of the cleaning methods described above.

The inventors have tried to clean a ceramic member with an organic acid such as oxalic acid or a weak acid, and successfully reduced the amount of metal atoms transferred from a ceramic member to a semiconductor, as compared with the other cleaning methods. This finding leads the inventors to achieve this invention.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

FIG. 4 is a sectional view of the mounting surface 2a of the ceramic member 2 in FIG. 3 with a semiconductor wafer W mounted thereon.

DETAILED DESCRIPTION OF THE INVENTION

Figure 1:
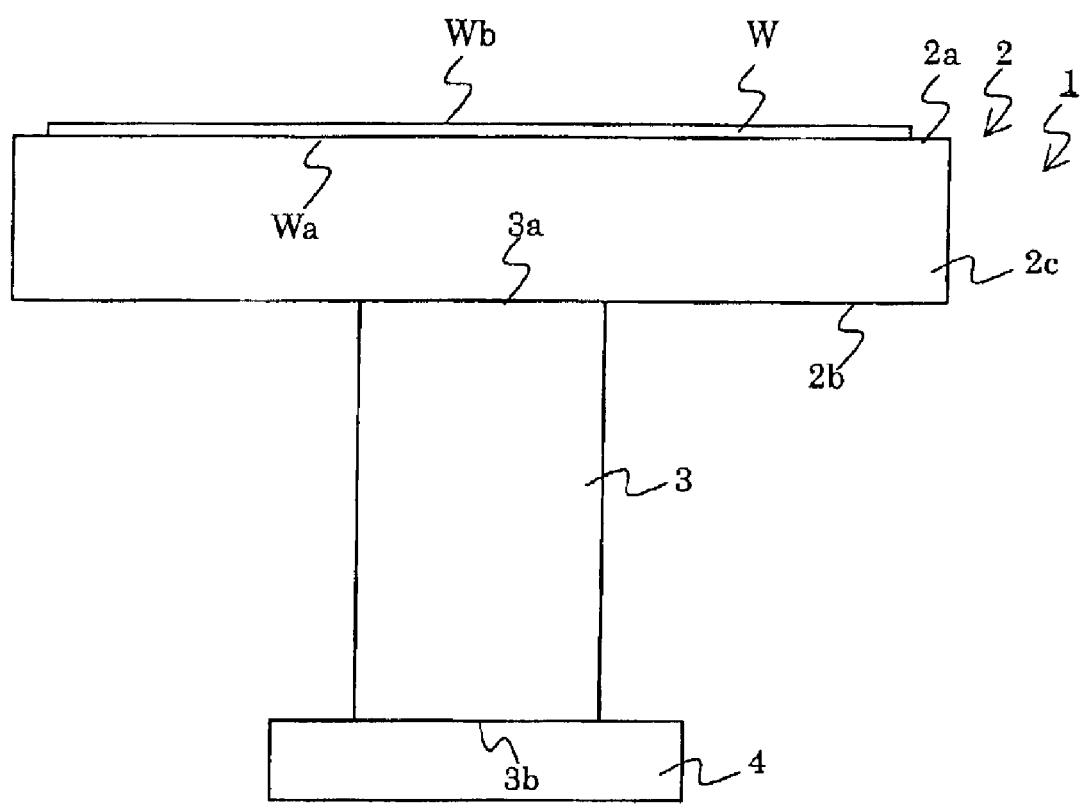
FIG. 1 is a schematic view of a semiconductor mounting device with a semiconductor wafer W mounted thereon.

Organic acids available for use in the present invention can be exemplified as follows.

(1) Carboxylic acids
  (Mono-substituted carboxylic acids)
    Aliphatic carboxylic acids such as acetic acid, acrylic acid and propionic acid
    Aromatic carboxylic acids such as benzoic acid, phthalic acid, isophthalic acid and terephthalic acid
  (Di-substituted carboxylic acids)
    Aliphatic carboxylic acids such as oxalic acid, glutaric acid, adipic acid, malonic acid, succinic acid, maleic acid, fumaric acid and tartaric acid
    Aromatic carboxylic acids such as nicotinic acid
  (multi-substituted carboxylic acids)
    Citric acid, etc.
(2) Organic compounds having phenolic hydroxyl groups
(3) Aliphatic amines A weak acid used for this invention may preferably have a dissociation constant in water of not higher than 5. The weak acids can be exemplified as follows.

(1) Carboxylic acids described above
(2) Aromatic amines

A system for producing a semiconductor means a system usable in a wide variety of semiconductor processing in which metal contamination of a semiconductor is to be avoided. Such a system includes film forming, etching, cleaning and testing systems.

The ceramic member includes, for example, a susceptor for mounting a semiconductor wafer thereon, a dummy wafer, a shadow ring, a tube for generating high frequency plasma, a dome for generating high frequency plasma, a high frequency wave-permeable window, an infrared radiation-permeable window, a lift pin for supporting a semiconductor wafer, a shower plate, an electrostatic chuck and a vacuum chuck. The member further includes an article having a ceramic substrate and an electrode for generating high frequency plasma embedded in the substrate, and an article having a ceramic substrate and a resistance heat generator embedded in the substrate.

The material of the ceramic member is not restricted. For further reducing contamination of a semiconductor, an aluminum nitride base ceramics, a composite material containing aluminum nitride, an alumina base ceramics, a composite material containing alumina, and a composite ceramics composed of alumina and aluminum nitride are preferred.

The content of metal elements not constituting the ceramic material for the ceramic member may preferably be smaller and more preferably not higher than 100 ppm. Particularly, the total content of metal elements of Ia to VIIa, VIII, Ib and IIb in the periodic table, as well as a part of elements of IIIb and IVb in the periodic table (such as Si, Ga and Ge), may preferably be not higher than 100 ppm. The contents can be measured by ICP method.

According to this invention, a ceramic member may be cleaned with a strong acid, followed by cleaning with an organic acid or a weak acid. In this specification, a strong acid means an acid having a dissociation constant in water of not lower than 6. The strong acid includes nitric acid, hydrochloric acid, a mixture of hydrochloric acid and nitric acid, sulfuric acid and hydrofluoric acid.

The inventors found that, it is particularly effective to perform a blasting treatment on the surface of the ceramic member, followed by the cleaning with an organic acid or a weak acid. The reason may be speculated as follows.

Even if powered materials for the ceramic member is highly purified and the amount of contaminated metals in the powered materials is restricted to be quite infinitesimal, metal atoms may be diffused in the surface region of the ceramic member for various reasons. Though the reasons are not well defined, for example, metal atoms in an electric power supply equipment or in the furnace atmosphere at the manufacture may be transferred or diffused into the surface region of the ceramic member, when the ceramic member is heated. Transition metal elements, particularly copper, can be easily diffused.

In this case, metal atoms may be diffused into the surface region of a ceramic member at a depth of several $\mu$m. It may be effective to grind and remove the surface region of the ceramic member by a blasting treatment for preventing the transfer of metal atoms from the ceramic member to a semiconductor.

It is noted that, when the surface of the ceramic member is cleansed with a strong acid after a blasting treatment, the metal contamination of a semiconductor may not be reduced to the degree that may be expected according to the present invention. It is surprisingly found that the cleaning of the ceramic member with a weak acid or an organic acid may result in superior effect of preventing the metal contamination of a semiconductor, as compared with the effect obtained by the cleaning with a strong acid.

As to cleaning procedure to be performed after a blasting treatment, ultrasonic cleaning with an organic solvent and purified water may be exemplified. Furthermore, for further reducing the metal contamination, cleaning by applying a combination of a weak acid and an organic acid may be preferred. As to other procedures, cleaning by ozonized water, hydrogenized water or electrolyzed water may be also effective. The concentration of ozonized water may preferably be not lower than 5 ppm and the concentration of hydrogenized water may preferably be not lower than 1 ppm.

The blasting treatment includes the following process.
(Sandblast)

A blasting material for sandblasting may preferably be a ceramic material such as silicon carbide or alumina. Metals are not preferable because they can be a source of metal contamination. The particle diameter of the blast material may preferably be smaller than #180, for reducing damage caused on the surface of the ceramic member and the content of residual metal components on the damaged area. The blast nozzle material may preferably be a ceramics. Wet and dry processes are both available.

FIG. 1 is a schematic view of a semiconductor mounting device 1 with a semiconductor wafer W mounted thereon. The device 1 has a ceramic member 2, a cylindrical holder 3 supporting the ceramic member 2, and a basement 4. An end face 3a of the holder 3 is connected to a back face 2b of the ceramic member 2. The other end face 3b of the holder 3 is connected to the basement 4. In this example, the ceramic member 2 is a susceptor having a planer shape and the semiconductor wafer W is placed on a semiconductor mounting surface 2a of the ceramic member 2, with portion 2c being is a side face of the ceramic member 2. For example, a resistance heat generator or an electrostatic chuck electrode may be buried in the ceramic member 2.

With the semiconductor wafer W mounted on the semiconductor mounting surface 2a, the semiconductor wafer W is heated at a temperature higher than 500° C., for example. Metal atoms may be diffused from the semiconductor mounting surface 2a of the ceramic member 2 to the surface region of the semiconductor wafer W. According to this invention, at least the semiconductor mounting surface 2a of the ceramic member 2 can be cleansed to inhibit such transfer and diffusion of the metal atoms.

In a preferred embodiment, embossed portions may be provided on the semiconductor mounting surface of the ceramic member, so that a contacting area of the ceramic member and semiconductor may be reduced. The above described diffusion of metal elements from the ceramic member to semiconductor may occur at the contacting surface between the ceramic member and the semiconductor. It is therefore effective to provide the embossed portions and thus to reduce the contacting area of the member and semiconductor, for preventing the diffusion of the metal atoms into the semiconductor.

Moreover, when a semiconductor is heated on the ceramic member for semiconductor treatment or film formation, metal contaminants are released into the semiconductor chamber, resulting in metal diffusion into the semiconductor. The inventors found that it is one reason of promoting the metal diffusion into the semiconductor.

In a preferred embodiment, an embossed portion surrounding at least a part of the semiconductor mounting surface of the ceramic member may be provided on the mounting surface. Then the inner space of the embossed portion may be sealed against the inner space of the chamber. As a result, it is possible to prevent the invasion of metal contaminants present in the atmosphere in a test chamber to a gap between the back face of the semiconductor and the mounting surface of the heater. The metal diffusion into the semiconductor wafer may be thus reduced.

In a preferred embodiment, in a planar view of the semiconductor mounting surface, the embossed portion forms a closed curve. The planar shape of the embossed portion is not particularly restricted, and includes a ring shape and a polygonal shape such as triangle or quadrangle. In a particularly preferred embodiment, the planar shape of the embossed portion may be a closed circle or a ring in the peripheral part of the semiconductor mounting surface.

In a still preferred embodiment, a communicating hole with an opening to the semiconductor mounting surface formed therein is provided in the ceramic member. Additionally, an embossed portion encompassing the opening may be also provided. Typically, this communicating hole is a through hole for inserting a lift pin. Even in this case, the diffusion of metal atoms to the semiconductor may occur by influx of atmosphere in the communicating hole from a semiconductor chamber. It is therefore possible to provide an embossed portion surrounding the opening, so that atmosphere in the communicating hole may be sealed up to prevent the diffusion of metal atoms from the atmosphere into the semiconductor.

In this case, in a plan view of the semiconductor mounting surface, the embossed portion should form a closed curve. The planar shape of the embossed portion is not particularly restricted, and includes a ring shape, and a polygonal shape such as triangle or quadrangle.

Figure 2:
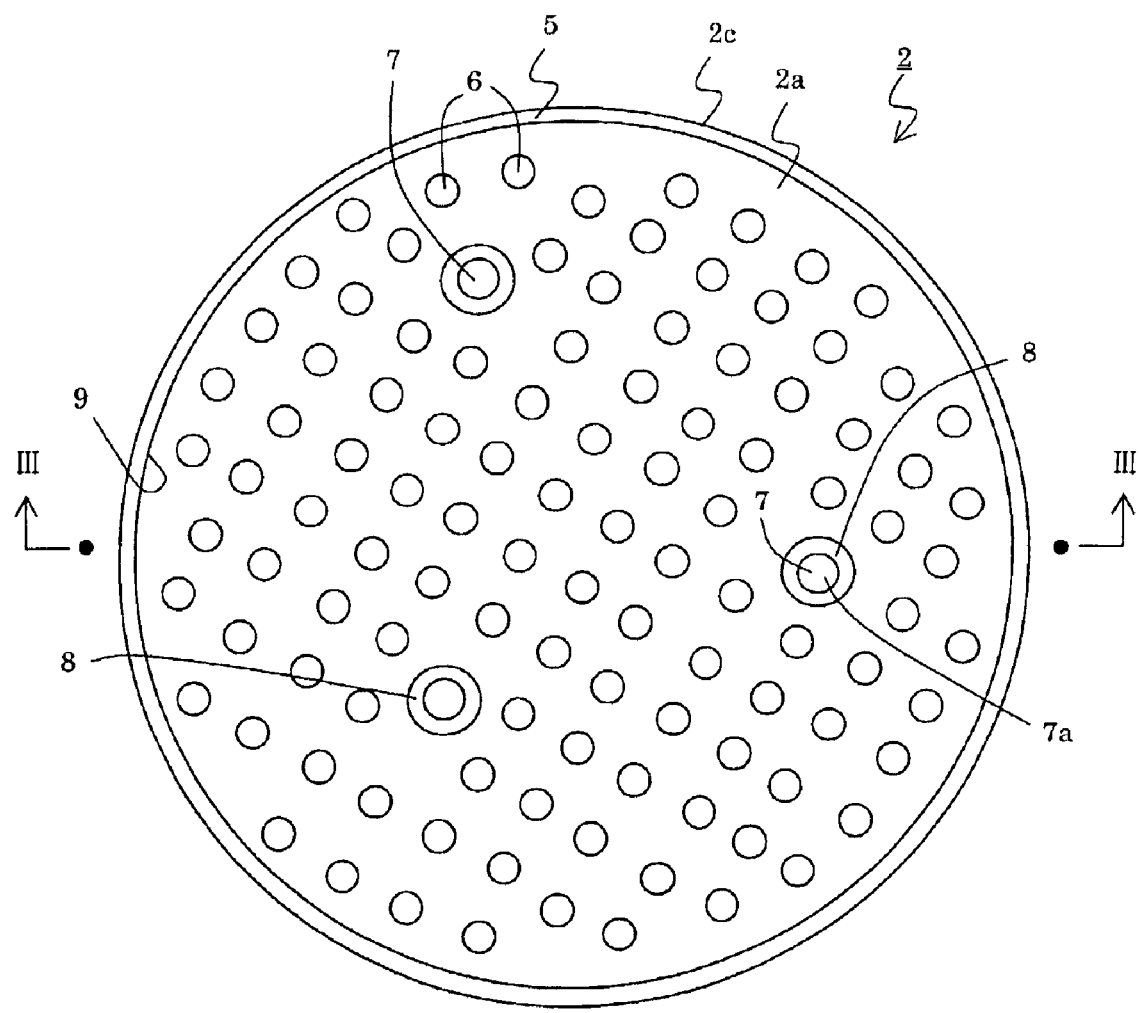
FIG. 2 is a plane view schematically showing a planar shape of a semiconductor mounting surface 2a of a ceramic member 2 according to one embodiment of this invention.
Figure 3:
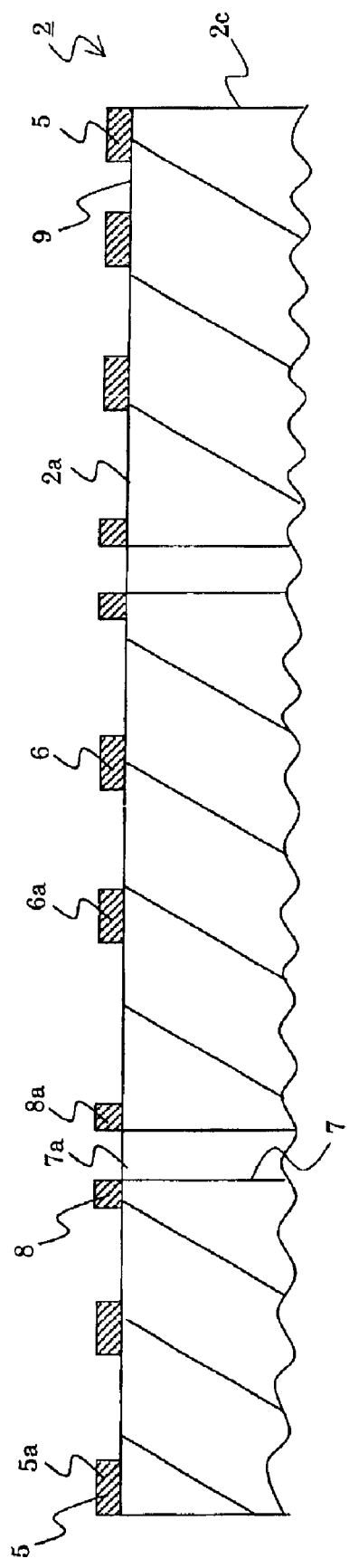
FIG. 3 is a sectional view of a proximal region of the mounting surface 2a of the ceramic member 2 in FIG. 2.

FIGS. 2 to 4 relate to this embodiment. FIG. 2 is a plan view schematically showing a ceramic member 2 according to this embodiment viewed from the side of a semiconductor mounting surface 2a. FIG. 3 is a cross sectional view schematically showing the mounting surface 2a of the member 2, corresponding with the cross section cut along a line III—III of FIG. 2. FIG. 4 is a cross sectional view schematically showing a semiconductor wafer W mounted on the mounting surface 2a of the member 2 of FIG. 3.

In the present invention, the mounting surface 2a substantially has a shape of a circle. A ring shaped embossed portion 5 is formed in the peripheral part of the mounting surface 2a. The ring shaped embossed portion 5 surrounds the mounting surface 2a. For example, three communicating holes 7 are formed in the ceramic member 2. Each hole 7 is formed through the member 2 between the mounting surface 2a to the back face 2c. In the present example, the communicating holes 7 are used as through holes for inserting lift pins, respectively. Ring shaped embossed portions 8 are formed so that each embossed portion 8 surrounds each opening 7a of each communicating hole 7. Many small embossed portions 6 are regularly formed at specified intervals in a region between the outer ring shaped embossed portion 5 and inner embossed portions 8 on the mounting surface.

As shown in FIG. 4, when the semiconductor wafer W is mounted on the mounting surface, the back face Wa of the wafer W contacts with the upper faces 6a, 5a and 8a of the embossed portions 6, 5 and 8. As a result, a closed space 9 is formed and defined by the wafer W and mounting surface. Another closed spaces 10 are also formed inside of the embossed portions 8. The closed spaces 10 are separated from the closed space 9.

According to this invention, the height of the embossed portion is not particularly restricted. However, for further reducing diffusion of metal elements from the ceramic member to the semiconductor, the height may preferably be not lower than 10 μm.

According to this invention, the diameter $\emptyset$ of individual embossed portion may be variously changed. However, for further reducing diffusion of metal elements from the ceramic member to the semiconductor, the diameter $\emptyset$ may preferably be not higher than 5 mm. Moreover, on the standpoint of maintaining the semiconductor stable, the diameter $\emptyset$ may preferably be not lower than 0.2 mm.

Moreover, the contact area of the embossed portions and the semiconductor is not lower than 0.001% of the backside area of the semiconductor. The percentage may preferably be not lower than 3% or not higher than 20%.

Moreover, the width of the circular embossed portion provided in the peripheral part of the semiconductor mounting surface may preferably be not smaller than 0.5 mm and not larger than 10 mm. Moreover, the height of the circular embossed portion provided in the peripheral part of the semiconductor mounting surface may preferably be not lower than 10 μm.

Moreover, the planar shape and planar size of individual island-like dispersed embossed portion 6 can be variously altered. For example, the shape of contacting surface 6a of the embossed portion 6 to the semiconductor may be circular, or a polygonal shape such as triangle, quadrangle, hexagon or octagon. Otherwise, it may be ring or strip shaped. Moreover, the number of the embossed portions 6 is not particularly restricted.

The shape of each embossed portion can be measured by a dial gauge or a three dimensional shape measuring device.

The material of the embossed portion is not particularly restricted. However, for further reducing contamination of semiconductor, an aluminum nitride base ceramics, a composite material containing aluminum nitride, an alumina base ceramics, a composite material containing alumina, and a composite ceramics composed of alumina and aluminum nitride are preferred. The embossed portion can be formed by blasting or chemical vapor deposition.

EXAMPLES

Comparative Example 1

A ceramic heater with a planar shape was manufactured. Specifically, aluminum nitride powder obtained by a reduction nitriding process was used. An acrylic resin binder was added therein, and then the mixture was granulated by a spray dryer to obtain granulated grains. Three sheets of molded bodies were sequentially made by uniaxial press-molding of the granulated grains. The three layers of molded bodies were then stacked to provide a single press-molded body. A coil-like resistance heat generator made of molybdenum was buried in the press-molded body.

The molded body was placed in a hot press mold, which was then hermetically sealed. When the molded body was heated, the pressure was reduced in a temperature range from room temperature to 1000° C. After the temperature reached at 1000° C., the pressure was elevated as the increase of the temperature. The maximum temperature was 1800° C. and the molded body was held and fired at the maximum temperature under 200 kgf/cm$^2$ for four hours in nitrogen gas to obtain a sintered body. The sintered body was then subjected to machine working and finishing to produce a heater. The diameter and thickness of the ceramic member 2 were 240 mm and 18 mm, respectively. The semiconductor mounting surface was then cleaned according to the procedures described below.

The ceramic member 2 was then furnished as shown in FIG. 1, and the mirror finished surface of 8-inched silicon wafer was placed on the semiconductor mounting surface 2a of the ceramic member 2. Electric power was then supplied to the resistance heat generators and the average temperature on the semiconductor mounting surface 2a of the ceramic member 2 was set to about 650° C. The pressure in the chamber was set to $1\times10^{-3}$ Torr. The temperature was kept at 650° C. for 10 min, subsequently the temperature was lowered and the silicon wafer was detached from the ceramic member 2.

The amount of metal elements diffused in the silicon wafer was then measured by ICP-MS method. That is, the surface of the silicon wafer was treated with 1 cm$^3$ of a mixed acid comprising hydrofluoric acid and hydrogen peroxide water, the sample solution obtained was batched off and then evaporated. The residue was dissolved in hydrofluoric water and sprayed to an ICP (inductive coupling plasma) mass spectrometer. The sprayed solution was ionized by plasma in the spectrometer. Excessive elements were removed by passing the ions through an ionic lens. Then direction of the ions was bent at 90 degree in the smaller order of the mass numbers of elements by + and − electrodes of quadplex polar electrode system. By this procedure, the count numbers of ions could be detected for each mass number.

As a result, the count number of copper was $6.5\times10^{11}$ atoms/cm$^2$.

Comparative Example 2

The ceramic member 2 was manufactured, and then the semiconductor mounting surface was cleansed by a nylon scrub brush. As a result, the count number of copper was $1.20\times10^{12}$ atoms/cm$^2$.

Comparative Example 3

In comparative example 2, the mounting surface was cleaned with a melamine foam instead of a nylon scrub brush. As a result, the count number of copper was $3.20\times10^{12}$ atoms/cm$^2$.

Comparative Example 4

After manufacture of the ceramic member 2, the semiconductor mounting surface was cleansed by SC-1 cleaning agent (NH$_4$OH:H$_2$O$_2$:H$_2$O=1:1:5), and then cleansed by nitric acid. As a result, the count number of copper was $3.0\times10^{11}$ atoms/cm$^2$.

Comparative Example 5

The ceramic member 2 was manufactured and then the semiconductor mounting surface was subjected to blasting as in comparative example 2. Then it was cleansed by nitric acid. As a result, the count number of copper was $2.0\times10^{11}$ atoms/cm$^2$.

Comparative Example 6

The ceramic member 2 was manufactured and then the semiconductor mounting surface was subjected to blasting as in comparative example 2. Then it was cleansed by hydrochloric acid. As a result, the count number of copper was $2.5\times10^{11}$ atoms/cm$^2$.

Example 1

The ceramic member 2 was manufactured and then the semiconductor mounting surface was subjected to blasting as in comparative example 2. Then it was cleansed by aqueous solution of oxalic acid. The concentration of oxalic acid was 1N and the treatment was performed for 5 minutes. As a result, the count number of copper was $4.7\times10^{10}$ atoms/cm$^2$.

Example 2

In the example 1, the concentration of oxalic acid was variously changed in the range of 0.01 to 1 N. As a result, the count number of copper was 4.7 to $6.6\times10^{10}$ atoms/cm$^2$.

Example 3

In the example 1, the time period for the treatment with oxalic acid was variously changed in the range of 1 to 10 min. As a result, the count number of copper was 4.7 to $6.0\times10^{10}$ atoms/cm$^2$. From these results, it was proved that the concentration of oxalic acid and the treatment time period did not substantially affect the results.

Example 4

The ceramic member 2 was manufactured and then the semiconductor mounting surface was subjected to blasting as in comparative example 2. Then it was cleansed by nitric acid and subsequently by hydrochloric acid. At last, it was cleansed by aqueous solution of oxalic acid. The concentration of oxalic acid was 1N and the treatment was performed for 3 minutes. As a result, the count number of copper was $4.6\times10^{10}$ atoms/cm$^2$.

Example 5

The ceramic member 2 was manufactured and then the semiconductor mounting surface was subjected to blasting as in comparative example 2. Then it was cleansed by hydrochloric acid and subsequently by aqueous solution of oxalic acid. The concentration of oxalic acid was 1N and the treatment was performed for 10 minutes. As a result, the count number of copper was $7.7\times10^{10}$ atoms/cm$^2$.

As described above, the present invention provides a method of cleaning a ceramic member so that the amount of metal transferred from the ceramic member to a semiconductor may be considerably reduced.

The present invention has been explained referring to the preferred embodiments. However, the present invention is not limited to the illustrated embodiments which are given by way of examples only, and may be carried out in various modes without departing from the scope of the invention.

What is claimed is:

1. A method for cleaning a ceramic member for use in a system for producing semiconductors, the method comprising the step of cleaning said ceramic member with oxalic acid, wherein said ceramic member has a semiconductor mounting surface having an embossed portion surrounding at least a part of said semiconductor mounting surface.

2. The method of claim 1, further comprising the step of cleaning said ceramic member with a strong acid before said member is cleaned with said oxalic acid.

3. The method of claim 1, further comprising the step of subjecting said ceramic member to a blasting treatment before said member is cleaned with said oxalic acid.

4. The method of claim 1, wherein said ceramic member is cleaned so that metal atoms diffused in the surface region of said ceramic member are reduced.

5. The method of claim 1, wherein said ceramic member further comprises a communicating hole formed therein and having an opening to said semiconductor mounting surface, and said embossed portion encompasses said opening.

6. A method for cleaning a ceramic member for use in a system for producing semiconductors, the method comprising the steps of:

subjecting said ceramic member to a blasting treatment; and cleaning said ceramic member with oxalic acid after said blasting treatment, wherein said ceramic member has a semiconductor mounting surface having an embossed portion surrounding at least a part of said semiconductor mounting surface.

7. The method of claim 6, wherein said ceramic member is cleaned so that metal atoms diffused in the surface region of said ceramic member are reduced.

8. The method of claim 6, wherein said ceramic member further comprises a communicating hole formed therein and having an opening to said semiconductor mounting surface, and said embossed portion encompasses said opening.

* * * * *